United States Patent
Saitoh et al.

(10) Patent No.: US 7,629,629 B2
(45) Date of Patent: Dec. 8, 2009

(54) SEMICONDUCTOR NANOWIRE AND SEMICONDUCTOR DEVICE INCLUDING THE NANOWIRE

(75) Inventors: Tohru Saitoh, Osaka (JP); Takahiro Kawashima, Osaka (JP)

(73) Assignee: Panasonic Corporation, Osaka (JP)

( * ) Notice: Subject to any disclaimer, the term of this patent is extended or adjusted under 35 U.S.C. 154(b) by 416 days.

(21) Appl. No.: 10/588,605

(22) PCT Filed: Dec. 21, 2005

(86) PCT No.: PCT/JP2005/023495

§ 371 (c)(1),
(2), (4) Date: Aug. 7, 2006

(87) PCT Pub. No.: WO2006/070670

PCT Pub. Date: Jul. 6, 2006

(65) Prior Publication Data

US 2008/0224122 A1    Sep. 18, 2008

(30) Foreign Application Priority Data

Dec. 28, 2004    (JP) .............................. 2004-381574

(51) Int. Cl.
H01L 29/76    (2006.01)
(52) U.S. Cl. ........................... 257/213; 257/20; 257/24; 257/27; 257/E29.255; 257/E51.04; 977/762; 977/938
(58) Field of Classification Search .................. 257/20, 257/24, 27, 213, E29.255, E51.04; 977/762, 977/938
See application file for complete search history.

(56) References Cited

U.S. PATENT DOCUMENTS

| 7,067,867 B2 * | 6/2006 | Duan et al. ................... 257/296 |
| 2002/0130311 A1 | 9/2002 | Lieber et al. |
| 2002/0163079 A1 | 11/2002 | Awano |
| 2003/0089899 A1 | 5/2003 | Lieber et al. |
| 2004/0005723 A1 | 1/2004 | Empedocles et al. |
| 2005/0142766 A1 | 6/2005 | Hareland et al. |

(Continued)

FOREIGN PATENT DOCUMENTS

JP    2004-507104    3/2004

(Continued)

OTHER PUBLICATIONS

Duan, X., et al. "High-Performance Thin-Film Transistors Using Semiconductor Nanowires and Nanoribbons," Nature, vol. 425, Sep. 18, 2003, pp. 274-278.

(Continued)

Primary Examiner—Andy Huynh
(74) Attorney, Agent, or Firm—McDermott Will & Emery LLP

(57) ABSTRACT

A nanowire (100) according to the present invention includes a plurality of contact regions (10a, 10b) and at least one channel region (12), which is connected to the contact regions (10a, 10b). The channel region (12) is made of a first semiconductor material and the surface of the channel region (12) is covered with an insulating layer that has been formed selectively on the channel region (12). The contact regions (10a, 10b) are made of a second semiconductor material, which is different from the first semiconductor material for the channel region (12), and at least the surface of the contact regions (10a, 10b) includes a conductive portion.

39 Claims, 12 Drawing Sheets

U.S. PATENT DOCUMENTS

2005/0212079 A1* 9/2005 Stumbo et al. .............. 257/528
2006/0008942 A1* 1/2006 Romano et al. ............... 438/99

FOREIGN PATENT DOCUMENTS

| JP | 2005-510711 | 4/2005 |
| WO | WO 02/080280 A1 | 10/2002 |
| WO | WO 03/046536 A1 | 6/2003 |
| WO | WO 2004/032191 A2 | 4/2004 |
| WO | WO 2004/032193 A2 | 4/2004 |

OTHER PUBLICATIONS

Chen, X., et al. "Electron Mobility Enhancement in Strained SiGe Vertical n-type Metal-oxide-semiconductor Field-effect Transistors," American Institute of Physics, vol. 78, No. 3, Jan. 15, 2001, pp. 377-379.

* cited by examiner (a)

(b)

(c)

(a)

(b)

(c)

20 Device Substrate

SEMICONDUCTOR NANOWIRE AND SEMICONDUCTOR DEVICE INCLUDING THE NANOWIRE

RELATED APPLICATION

This application is a national phase of PCT/JP2005/023495 filed on Dec. 21, 2005, which claims priority from Japanese Application No. 2004-381574 filed on Dec. 28, 2004, the disclosures of which Applications are incorporated by reference herein. The benefit of the filing and priority dates of the International and Japanese Applications is respectfully requested.

1. Technical Field

The present invention relates to a semiconductor nanowire. More particularly, the present invention relates to a semiconductor nanowire, having a novel structure that contributes to realizing a contact with low resistance, and to a semiconductor device including such a semiconductor nanowire.

2. Background Art

In the field of nanotechnology, wires having a nanometer-order diameter (nanowires) and tubes also having a nanometer-order diameter (nanotubes) have been researched extensively. Among other things, a transistor using a semiconductor nanowire, formed by self-organization, for a channel region is attracting a lot of attention. A semiconductor nanowire may be grown on a substrate by a VLS (vapor-liquid-solid) mechanism, for example, after metal fine particles, acting as a catalyst for crystal growth, have been formed on the substrate (see, for example, Patent Document No. 1). Thus, in order to integrate practical transistor circuits together on the substrate, the semiconductor nanowire needs to be grown at a target position.

According to another technique reported, a Si nanowire that has been grown on a second substrate is dispersed in a solvent and then the solvent is applied onto a plastic substrate, thereby forming a thin film transistor of the Si nanowire on the plastic substrate (see Non-Patent Document No. 1).

Patent Document No. 1: Japanese Patent Application PCT National Phase Publication No. 2004-507104

Non-patent Document No. 1: "High-Performance Thin-Film Transistors Using Semiconductor Nanowires and Nanoribbons", Nature, Vol. 425, 18, Sep. 2003, pp. 274-278

DISCLOSURE OF INVENTION

Problems to be Solved by the Invention

According to the technique disclosed in Patent Document No. 1, a growth substrate that can resist a temperature of about 820° C. to about 1150° C., where crystals grow by the VLS mechanism, needs to be used as a circuit substrate. Therefore, a plastic substrate cannot be used as the growth substrate. Consequently, it is difficult to make a thin film transistor of a semiconductor nanowire on a plastic substrate.

Meanwhile, according to the technique disclosed in Non-Patent Document No. 1, the nanowire growth substrate and an application substrate can be made of different materials. Therefore, it is possible to make a thin film transistor of a nanowire on a plastic substrate. Non-Patent Document No. 1 also discloses a structure in which a thermal oxide film of silicon dioxide coats the nanowire entirely. The nanowire is entirely coated with a silicon dioxide film to keep the interface between the nanowire and the silicon dioxide film clean enough to ensure good interface properties when the silicon dioxide film is used as a portion of the gate insulating film.

If such a nanowire that is entirely coated with a silicon dioxide film is used, however, it is difficult to establish an electric contact between the nanowire and the source/drain electrodes on the application substrate. This is because the silicon dioxide film should to be selectively removed by photolithographic and etching techniques from the contact regions of the nanowire after the nanowire has been arranged on the application substrate.

Also, the areas of contact between the nanowire and the source/drain electrodes are small and a plastic substrate could not withstand even a heat treatment that should be done to reduce the contact resistance.

In order to overcome the problems described above, a primary object of the present invention is to provide a nanowire with a novel structure contributing to reducing the contact resistance.

Another object of the present invention is to provide nanowires that can be aligned easily.

Still another object of the present invention is to provide a semiconductor device including such a nanowire.

Means for Solving the Problems

A nanowire according to the present invention includes a plurality of contact regions and at least one channel region, which is connected to the contact regions. The channel region is made of a first semiconductor material and the surface of the channel region is covered with an insulating layer that has been formed selectively on the channel region. The contact regions are made of a second semiconductor material, which is different from the first semiconductor material for the channel region, and at least the surface of the contact regions includes a conductive portion.

In one preferred embodiment, the first semiconductor material is $Si_xGe_{1-x}$ (where $0<x\leq1$) and the second semiconductor material is $Si_yGe_{1-y}$ (where $0\leq y<1$ and $x\neq y$).

In another preferred embodiment, the insulating layer is made of an oxide of the first semiconductor material.

In this particular preferred embodiment, the insulating layer is formed by thermally oxidizing the surface of the channel region.

In still another preferred embodiment, the insulating layer covers the surface of the channel region but does not cover the surface of the contact regions.

In yet another preferred embodiment, the channel region has a length of 1,000 nm or less as measured along the axis of the nanowire.

In yet another preferred embodiment, the conductive portion of the contact regions is made of the second semiconductor material that has been doped with a dopant and that has a higher conductivity than the channel region.

In yet another preferred embodiment, the conductive portion of the contact regions is made of an alloy in which a constituent element of the second semiconductor material and a metal element are bonded together.

In this particular preferred embodiment, the contact regions include a core portion, which is made of a semiconductor material including an element that is bonded to the metal element in the conductive portion.

In a specific preferred embodiment, the alloy is either a metal compound of silicon or a metal compound of germanium.

In yet another preferred embodiment, the number of the contact regions is N, which is an integer equal to or greater than three, and the number of the channel region is M, which is N−1.

In this particular preferred embodiment, the contact regions and the channel regions are alternately arranged at a predetermined pitch along the axis of the nanowire.

In yet another preferred embodiment, the nanowire is arranged between two electrodes, each of which is electrically in contact with at least a portion of the contact regions of the nanowire. If the length of each said channel region is $L_{ch}$, the distance between the two electrodes is $L_{SD}$, the length of the contact regions is $L_{cont}$, the length of one of the two electrodes in a channel length direction is $L_S$, and the length of the other electrode in the channel length direction is $L_D$, the following inequalities:

$$L_S > L_{ch} \quad (1)$$

$$L_D > L_{ch} \quad (2)$$

$$L_{SD} > L_{cont} \quad (3)$$

are satisfied.

A method of making a nanowire according to the present invention includes the steps of: (A) providing a nanowire member that includes a portion made of a first semiconductor material and a portion made of a second semiconductor material, which is different from the first semiconductor material; and (B) selectively forming an insulating layer on the surface of the portion of the nanowire member that is made of the first semiconductor material and making at least the surface of the portion of the nanowire that is made of the second semiconductor material function as a conductive portion.

In one preferred embodiment, the method further includes the step (C) of alloying the surface of the portion of the nanowire member that is made of the second semiconductor material with a metal element by causing a chemical reaction between the surface and the metal element.

In another preferred embodiment, the step (A) includes the steps of: (a1) growing the first semiconductor material under a first crystal-growing condition; and (a2) growing the second semiconductor material under a second crystal-growing condition, which is different from the first crystal-growing condition.

In still another preferred embodiment, the step (B) includes the steps of: (b1) oxidizing the surface of the first and second semiconductor materials of the nanowire member, thereby forming an oxide film on the surface; and (b2) selectively removing a portion of the oxide film from the surface of the second semiconductor material, thereby leaving the other portion of the oxide film on the surface of the first semiconductor material.

In this particular preferred embodiment, the step (C) includes the steps of: (c1) forming a metal layer over the first and second semiconductor materials of the nanowire member; (c2) alloying the metal layer with the surface of the second semiconductor material where the metal layer and the surface contact with each other; and (c3) selectively removing a non-alloyed portion of the metal layer.

An electronic element according to the present invention includes at least one nanowire and a plurality of electrodes, which are electrically connected to the nanowire. Each said nanowire includes: a plurality of contact regions, including two contact regions that contact with associated ones of the electrodes, and at least one channel region, which is connected to the contact regions. The channel region is made of a first semiconductor material and is covered with an insulating layer that has been formed selectively on the channel region. And the contact regions are made of a second semiconductor material, which is different from the first semiconductor material, and at least the surface of the contact regions includes a conductive portion.

In one preferred embodiment, the electronic element further includes a gate electrode, which is insulated from the channel region and which applies an electric field to the channel region.

In another preferred embodiment, the channel region has a length of 1,000 nm or less as measured along the axis of the nanowire.

An electronic device according to the present invention includes the electronic elements, a line for connecting the electrodes together, and a substrate for supporting the electronic elements and the line thereon.

In one preferred embodiment, the nanowires included in the electronic elements are aligned in a particular direction on the substrate.

A method for fabricating an electronic device according to the present invention includes the steps of: preparing a solvent in which the nanowires described above are dispersed; applying the solvent onto a substrate; and bringing the contact regions of at least one of the nanowires in the solvent into contact with electrodes.

In one preferred embodiment, the step of applying the solvent onto the substrate includes the step of aligning the nanowires, dispersed in the solvent, in a particular direction.

EFFECTS OF THE INVENTION

In a nanowire according to the present invention, the surface of the channel region is selectively covered with an insulating layer. That is why unlike the conventional nanowire in which the surface is entirely covered with the insulating layer, the following effects are achieved by the present invention:

1. There is no need to perform the process step of removing the insulating coating from the contact regions by photolithographic and etching techniques (i.e., a contact etching process step) after the nanowire has been arranged on the substrate. As a result, not just can the manufacturing process be simplified but also can the possible decrease in production yield due to mask misalignment be minimized. Furthermore, if the insulating layer is used as a gate insulating film as it is, then the ends of the channel region will be automatically aligned with those of the insulating layer, thus improving the resultant transistor performance.

2. If one attempted to cover only the channel region with the insulating layer by photolithographic and etching techniques, then the length of the channel region as measured along the axis of the nanowire could never be shorter than the resolution limit of the photolithographic process. According to the present invention, however, the length of the channel region along the nanowire axis can be shorter than the resolution limit of the photolithographic process.

3. In a nanowire according to the present invention, each contact region includes a conductive portion even before the nanowire is arranged on the substrate. Therefore, a low contact resistance is easily realized between the nanowire and the electrodes of a field effect transistor, for example. Particularly if the nanowire itself already includes a conductive portion of a silicide, for example, the device substrate, which is prepared separately from the growth substrate, does not have to be subjected to a high-temperature process such as a silicidation process to reduce the contact resistance while an electronic element such as a transistor is being fabricated on the device substrate with the nanowire of the present invention arranged thereon. Therefore, a high-performance nanowire device can be fabricated on a substrate having a relatively low melting point or softening point (such as a plastic substrate).

Figure 1:
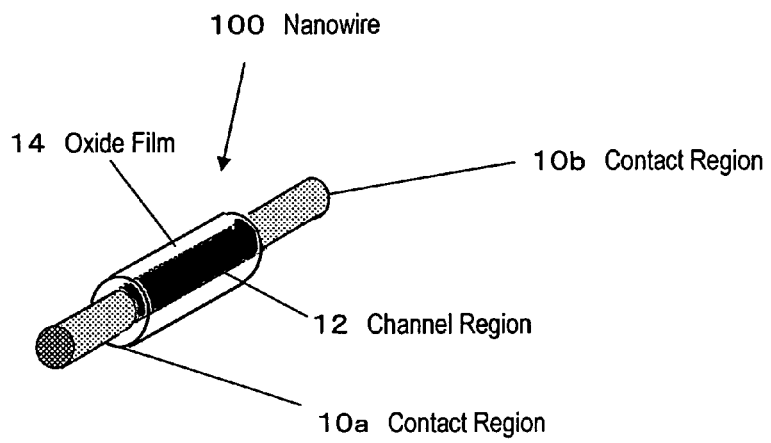
FIG. 1 is a perspective view of a nanowire 100 according to a first preferred embodiment of the present invention.

DESCRIPTION OF REFERENCE NUMERALS 10a contact region
10b contact region
12 channel region
14 oxide film
16a source electrode
16b drain electrode
20 device substrate
30 gate electrode
100 nanowire
100a Ge portion
100b Si portion
100c Ge portion

BEST MODE FOR CARRYING OUT THE INVENTION

According to the present invention, an electronic element such as a field effect transistor is fabricated using a nanowire characterized by its contact regions.

EMBODIMENT 1

Figure 2:
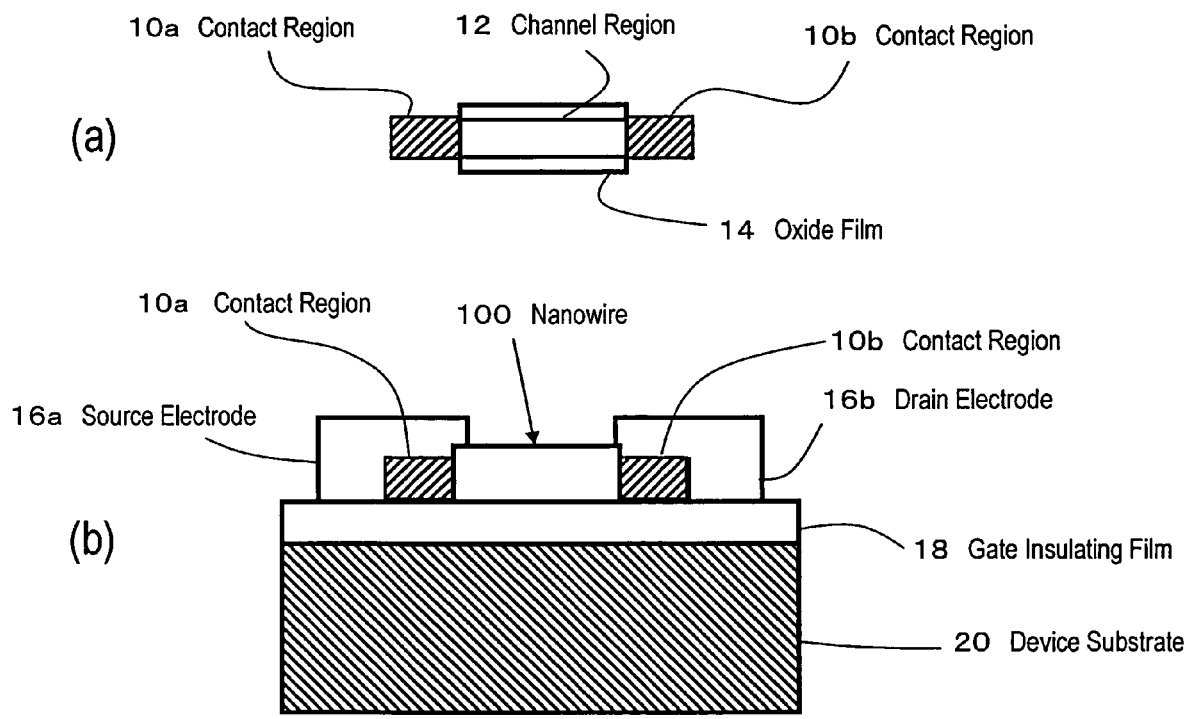
FIG. 2(a) is a cross-sectional view of the nanowire 100 as viewed in the longitudinal direction thereof and FIG. 2(b) is a cross-sectional view of a field effect transistor including the nanowire 100.

Hereinafter, a first preferred embodiment of a nanowire according to the present invention will be described with reference to FIGS. 1 and 2. FIG. 1 is a perspective view illustrating a nanowire 100 according to this embodiment. FIG. 2(a) is a cross-sectional view of the nanowire 100 as viewed in the longitudinal direction thereof. And FIG. 2(b) is a cross-sectional view of a field effect transistor including the nanowire 100.

The nanowire 100 shown in FIGS. 1 and 2 includes a pair of contact regions 10a and 10b and a channel region 12 connected to these contact regions 10a and 10b. In this embodiment, the channel region 12 is made of silicon (Si) while the contact regions 10a and 10b each have a conductive portion made of a non-silicon material at least on their surface. More specifically, the contact regions 10a and 10b each include a core portion of Ge that is heavily doped with a p-type dopant and an alloy portion that covers the outer surface of the core portion. In this example, a channel region of a p-type semiconductor is described. However, the same statement is applicable to an n-type channel region, too. The alloy portion on the surface of these contact regions 10a and 10b is made of a metal compound formed by making Ni react with the Ge surface. Meanwhile, the surface of the channel region 12 is covered with an oxide film 14.

In the example illustrated in FIG. 1, the conductive portion of the contact regions 10a and 10b is made of a silicide. However, this conductive portion does not have to be a silicide as long as the electrical resistance (or resistivity) thereof is sufficiently lower than that of the channel region. If at least the surface portion of the contact regions 10a and 10b of Ge has been heavily doped with a dopant, the electrical resistance thereof is reduced significantly. As a result, the surface of the contact regions 10a and 10b functions as a "conductive region".

Since the nanowire 100 of this embodiment includes the contact regions 10a and 10b with good conductivity at both ends thereof, the electrical contact resistance between the nanowire 100 and the electrodes can be reduced than the conventional one.

In the nanowire 100 of this preferred embodiment, the contact regions 10a and 10b will function as the source/drain regions of a transistor and the length of the channel region 12 along the nanowire axis will define the channel length of the transistor.

The field effect transistor shown in FIG. 2(b) includes the nanowire 100, source and drain electrodes 16a and 16b that respectively contact with the contact regions 10a and 10b of the nanowire 100, and a device substrate 20 for supporting these components thereon. The upper surface of the device substrate 20 is covered with a gate insulating film 18. And the device substrate 20 functions as a gate electrode for controlling the conductivity of the channel region 12 of the nanowire 100. In the example illustrated in FIG. 2(b), the device substrate 20 to support the nanowire 100 thereon has electrical conductivity and functions as a gate electrode. However, the gate electrode does not have to have such a configuration. As in a known TFT (thin film transistor), the gate electrode may be a conductive film pattern that has been formed on an insulating substrate of glass, plastic or any other suitable material.

Figure 3:
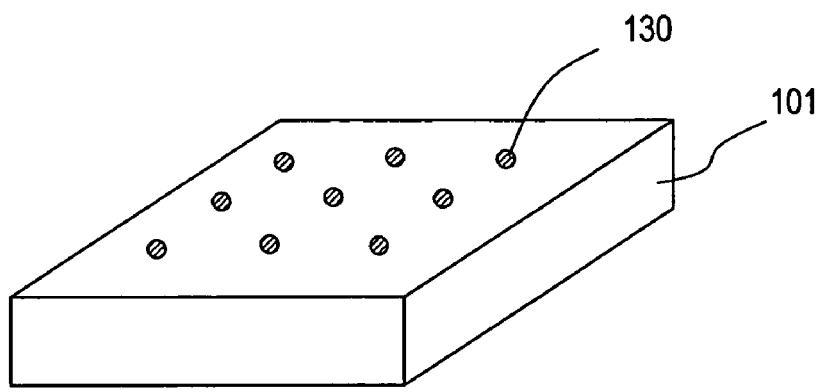
FIG. 3(a) is a perspective view of a support 101, on which catalyst fine particles 130 have been formed, in a process step of a nanowire manufacturing process according to the first preferred embodiment.
FIGS. 3(b) and 3(c) illustrate process steps for forming the catalyst fine particles 130.
Figure 3:
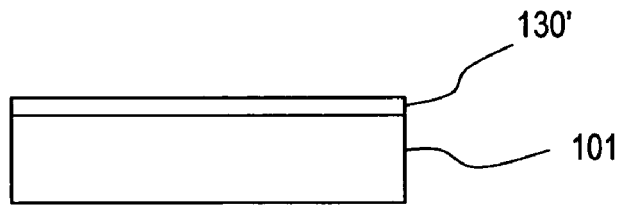
Figure 3:
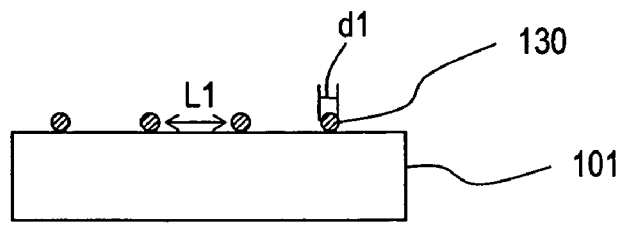
Figure 4:
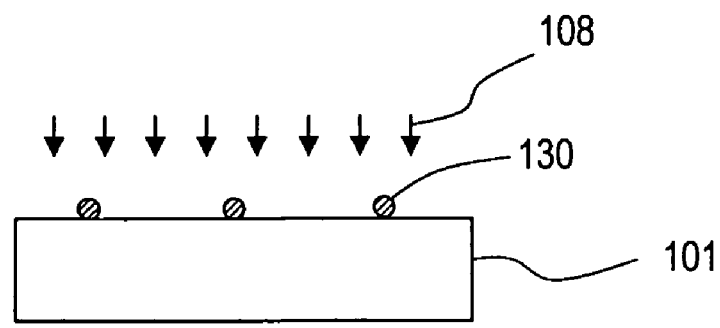
FIGS. 4(a) through 4(c) are cross-sectional views illustrating respective process steps for making the nanowire of the first preferred embodiment.
Figure 4:
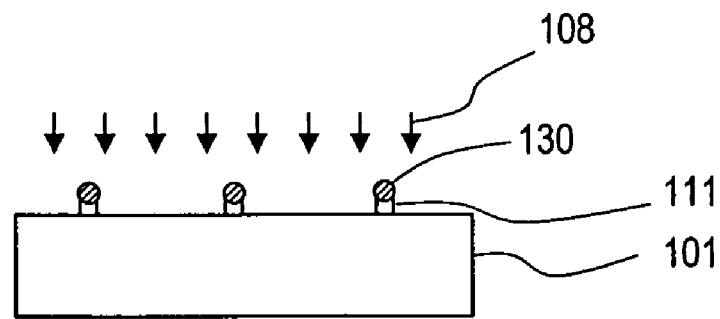
Figure 4:
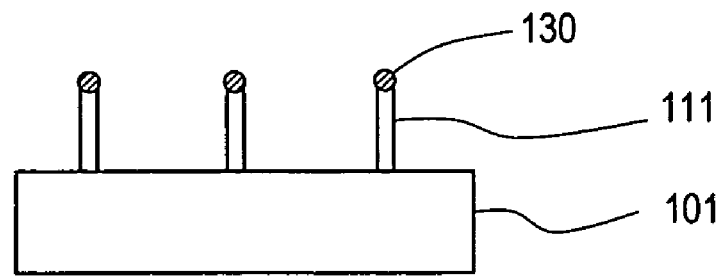

Hereinafter, a method of making a nanowire according to this preferred embodiment will be described with reference to FIGS. 3 and 4.

First, as shown in FIG. 3(a), catalyst fine particles 130 are formed on a support 101, which is used as a growth substrate.

The catalyst fine particles 130 function as a catalyst for decomposing a source gas when a single crystal semiconductor is grown (epitaxially). The support 101 may be made of any of various materials unless it is deformed at the heat-treatment temperatures in the rest of the manufacturing process. Specifically, the support 101 may be a glass substrate, a Si substrate, or a substrate including a silicon dioxide layer thereon, for example. The surface of the support 101 does not have to be crystalline. Also, the surface of the support 101 may be covered with a film of a different material from that of the body of the support 101.

The single crystal semiconductor to be grown to form a nanowire according to the present invention does not have to be Si or Ge that is adopted for this preferred embodiment, but may also be a compound semiconductor. More specifically, either single crystals of a Group III-V compound semiconductor such as GaAs, GaP, GaAsP, InP, InAs, or InAsP or single crystals of a Group II-VI compound semiconductor such as ZnS, ZnSe, CdS or CdSe may be grown instead.

As the catalyst metal element, Au, Fe, Ni, Ti or Pd may be used. These metals can promote the decomposition of the source gas effectively, form a eutectic state with a constituent element of the semiconductor, and promote the growth of the semiconductor. The size of the catalyst fine particles 130 is almost equal to the diameter of the semiconductor to be grown. Therefore, the diameter of the catalyst fine particles 130 may be determined to make a semiconductor member with a desired diameter. If the diameter of the catalyst fine particles 130 were too large, however, it would be difficult to grow a single crystal semiconductor. The diameter of the catalyst fine particles 130 is preferably in the range of 1 nm to 100 nm, and is more preferably in the range of 5 nm to 50 nm.

The catalyst fine particles 130 may be formed by a known method of making fine particles. For example, as shown in FIG. 3(b), a thin film 130' of a catalyst metal element is deposited on the surface of the support 101 by a sputtering or evaporation process using a known thin film deposition system. Then, the thin film 130' is heat-treated, thereby coagulating the thin film 130' by itself. As a result, as shown in FIG. 3(c), a plurality of catalyst fine particles 130 are formed on the support 101. The diameter d1 of the catalyst fine particles 130 and the distance L1 between two adjacent ones of the catalyst fine particles 130 vary with the thickness and the heat-treatment conditions of the thin film 130'. In other words, d1 and L1 may be changed by adjusting these parameters. As described above, the diameter d1 of the catalyst fine particles 130 is preferably equal to or smaller than 100 nm.

Alternatively, the catalyst fine particles 130 may also be formed by applying or spraying a solution, including a catalyst metal element, onto the surface of the support 101. Also, if necessary, the catalyst fine particles 130 may also be formed only in a selected area on the support 101 by patterning the thin film 130' deposited.

Next, the support 101, on which the catalyst fine particles 130 have been formed, is loaded into the chamber of a CVD system, for example. Then, as shown in FIG. 4(a), a source gas 108, including a constituent element of the semiconductor, is supplied into the chamber, and the atmosphere inside the chamber is maintained at a predetermined pressure. As a result, the surface of the support 101, having the catalyst fine particles 130 thereon, is exposed to the source gas atmosphere at the predetermined pressure. The support 101 is heated to a temperature that is lower than the temperature at which the source gas 108 decomposes.

As the source gas 108, a hydride of a constituent element of the semiconductor is preferably used. For example, in order to grow a Group IV semiconductor including Si or Ge, $SiH_4$, $Si_2H_6$, $GeH_4$ or any other suitable gas may be used.

In this preferred embodiment, the source gases 108 are changed from $GeH_4$ into $SiH_4$ and then from $SiH_4$ into $GeH_4$ again during the crystal-growing process as will be described more fully later. Also, a dopant gas is added to the source gas when necessary. In growing a compound semiconductor, an organic metal compound can be used effectively as the source gas.

As shown in FIG. 4(b), the source gas 108 supplied selectively decomposes only in the vicinity of the catalyst fine particles 130. As a result of the decomposition, the constituent element of the semiconductor is deposited, and the deposited element coagulates together, thus growing the single crystal semiconductor. In this manner, nanostructures 111 of the single crystal semiconductor are going to be formed little by little. It is not yet quite clear exactly how the single crystal semiconductor grows. However, it is at least highly probable that the as-deposited element should be, first of all, alloyed with the catalyst fine particles 130. This alloy is in a liquid state in many cases. The single crystal semiconductor should grow as follows. Specifically, as the element is deposited more and more, the concentration of the semiconductor constituent element increases gradually in the alloy. And once the concentration has reached a saturation value, the semiconductor constituent element would coagulate together, thus making the single crystal semiconductor.

Therefore, the crystals would grow at the boundary between the catalyst fine particles 130 and the nanostructures 111 consisting of the single crystal semiconductor grown. As the single crystal semiconductor grows taller, the catalyst fine particles 130 go farther and farther away from the support 101. The catalyst fine particles 130 are held at the end of the nanostructures 111 that is not in contact with the support 101. In this manner, the single crystal semiconductor grows and the nanostructures 111 are formed as shown in FIG. 4(c).

The nanostructures 111 made of the single crystal semiconductor that has grown in this manner preferably have a maximum diameter of 1 nm to 100 nm, more preferably 5 nm to 50 nm, on a cross section that is taken perpendicularly to the growth direction. Each nanostructure 111 is supported on the support 101, and the catalyst fine particle 130 is in contact with the top of the nanostructure 111. As described above, the catalyst fine particles 130 melt and assume a spherical shape while the semiconductor is growing. Therefore, the nanostructure 111 grown has a cylindrical shape. Alternatively, the cross section of the nanostructure 111 may also have a non-circular shape.

The length of the nanostructure 111 in the crystal growing direction is adjustable according to the process time of crystal growing process. If the crystal-growing process is performed for a sufficiently long time, even a nanostructure 111 having a length of several micrometers may be formed. If the diameter of the nanostructure 111 is equal to or smaller than 100 nm and if the crystal-growing direction agrees with the longitudinal direction of the nanostructure 111, the nanostructure 111 assumes a shape that is generally called a "nanowire".

In this example, the nanostructures 111 are supposed to grow substantially vertically upward from the support 101. Alternatively, the single crystal semiconductor may also grow either laterally (horizontally) or obliquely with respect to the surface of the support 101. Optionally, the growth conditions of the single crystal semiconductor may be optimized such that the single crystal semiconductor will grow earlier and faster in a particular direction. Or the single crystal semiconductor may even be grown in random directions, too.

Figure 5:
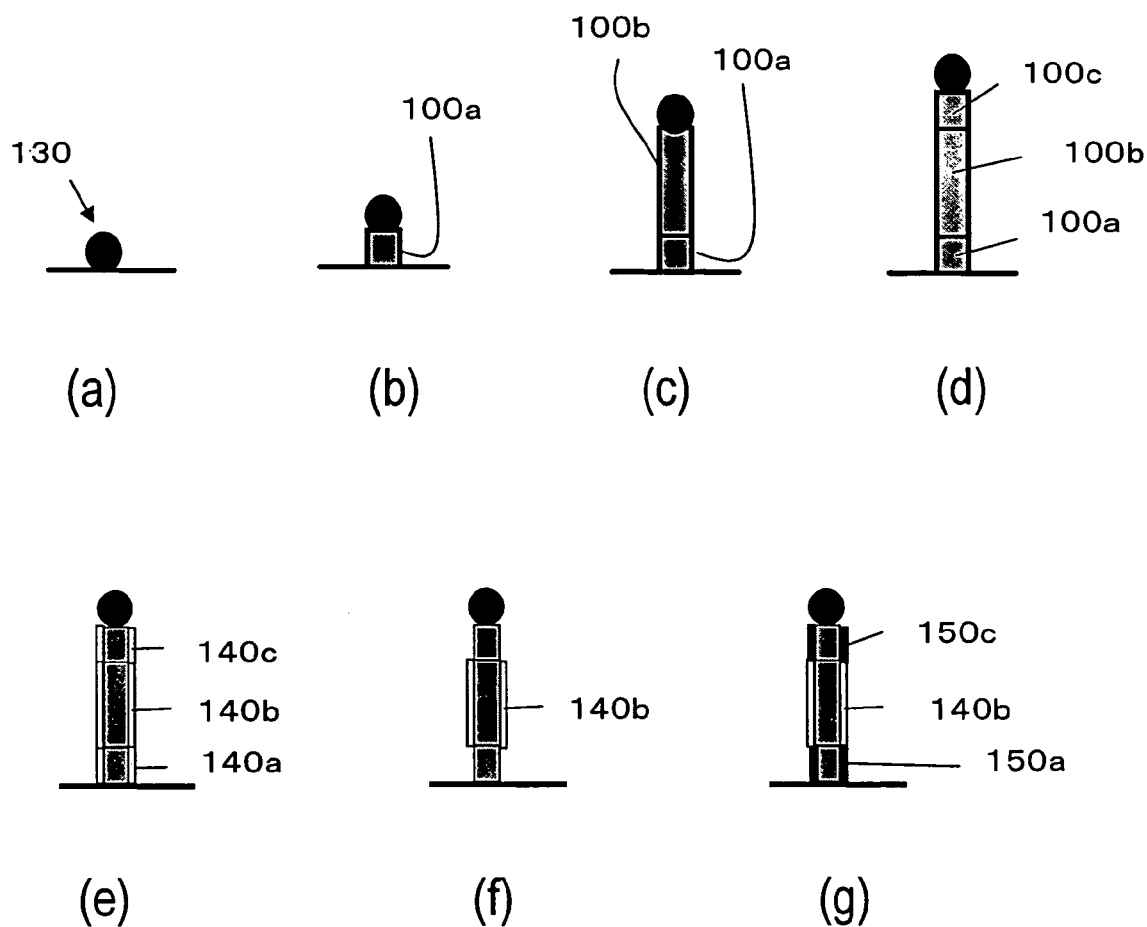
FIGS. 5(a) through 5(g) are cross-sectional views illustrating respective process steps for making the nanowire of the first preferred embodiment in further detail.

Hereinafter, the method of making a nanowire according to this preferred embodiment will be described in further detail with reference to FIG. 5.

First, as shown in FIG. 5(a), a catalyst metal particle 130 is formed on the substrate. Then, as shown in FIG. 5(b), Ge is grown. In this process step, $GeH_4$, to which $B_2H_6$ (p-type) or $PH_3$ (n-type) has been added as a dopant gas, is used as the source gas, and the substrate temperature is maintained at about 300° C. to 400° C., thereby growing a Ge portion 100a of the nanowire. The length of the Ge portion 100a may be selected from the range of 100 nm to 1,000 nm, for example. The Ge portion 100a will eventually play the role of the contact region 10a in the nanowire as a final product.

Next, the source gases are changed into $SiH_4$, thereby growing a Si portion 100b over the Ge portion 100a as shown in FIG. 5(c). This Si portion 100b will function as the channel region 12, and no dopant gas needs to be added to the source gas. If the nanowire is used for a p-channel transistor, however, the Si portion 100b is preferably lightly doped with an n-type dopant. On the other hand, if the nanowire is used for an n-channel transistor, the Si portion 100b is preferably lightly doped with a p-type dopant. Such channel doping is also realized by adding a very small amount of dopant gas to $SiH_4$.

The length of the Si portion 100b in the nanowire defines the channel length. By adjusting the growth rate and the growing process time of the Si portion 100b according to the design of the transistor to make, the Si portion 100b can have any desired length. In this preferred embodiment, the length of the Si portion 100b can be in the range of 100 nm to 5,000 nm, for example.

After the Si portion 100b has grown, the source gases are changed again into $GeH_4$, to which $B_2H_6$ (p-type) or $PH_3$ (n-type) has been added as a dopant gas. In this manner, a Ge portion 100c of the nanowire is grown over the Si portion 100b as shown in FIG. 5(d). The length of the Ge portion 100c may be in the range of 100 nm to 1,000 nm, for example.

Next, as shown in FIG. 5(e), the surface of the nanowire is thermally oxidized, thereby forming insulating layers 140a through 140c on the surface of the nanowire. The oxidation process may be carried out by using an $N_2O$ gas at a temperature of 750° C. to 900° C. and for a process time of approximately 30 minutes to approximately two hours. The insulating layers 140a, 140b and 140c may have any arbitrary thicknesses within the range of 2 nm to 50 nm. In the nanowire, the Ge oxide films 140a and 140c are formed on the surface of the Ge portions 100a and 100c, respectively, and the Si dioxide film 140b is formed on the surface of the Si portion 100b.

Next, the oxide films are etched away such that the Ge oxide films 140a and 140c are etched earlier and faster than the Si dioxide film 140b. Specifically, the nanowire with the thermally oxidized surface is immersed in an etchant such as hydrochloric acid (HCl) at a temperature of about 25° C. for approximately 1 to 10 minutes, thereby getting the selective etching done. As a result, a structure in which the surfaces of the Ge portions 100a and 100c are exposed and the (outer) surface of the Si portion 100b is covered with the insulating film (i.e., the Si dioxide film 140b) is formed as shown in FIG. 5(f).

Then, a metal (not shown) is deposited on the surface of the nanowire. In this case, if a CVD process is adopted, a metal layer can be easily formed so as to cover the entire surface of the nanowire. On the other hand, if a sputtering process is adopted, a metal layer tends to be partially formed on one side of the nanowire surface that is opposed to the metal target. Therefore, to cover the outer surface of the nanowire with the metal film being deposited by the sputtering process, the growth substrate is preferably rotated.

Portions of the metal layer that covers the outer surface of the nanowire are directly in contact with the Ge portions 100a and 100c, but the other portion thereof contacts with the Si dioxide film 140b on the outer surface of the Si portion 100b. Due to the presence of this interposed Si dioxide film 140b, the metal layer is not directly in contact with the Si portion 100b.

Next, the nanowire is subjected to a heat treatment process (i.e., an alloying process) such that the constituent metal element of the metal layer reacts with Ge to make a compound (i.e., an alloy) of the metal and Ge. As a result of this heat treatment process, the surface of the Ge portions 100a and 100c is alloyed but the surface of the Si portion 100b, covered with the Si dioxide film 140b, is not. Consequently, alloy layers 150a and 150c are formed at both ends of the nanowire.

Thereafter, the unreacted portion of the metal layer on the surface of the nanowire (i.e., the portion covering the Si dioxide film 140b) is selectively etched away, thereby completing a nanowire having the structure shown in FIG. 5(g). This nanowire is primarily characterized by including the alloy layers 150a and 150b in the contact regions at both ends thereof. The outer surface of the channel region is covered with an insulating film (i.e., the Si dioxide film 140b).

It should be noted that the alloy layers 150a and 150b arranged at both ends of the nanowire are not essential components for the present invention as described above. A good contact can be made if the doping level is sufficiently high at the surface of the Ge portions 100a and 100b. In that case, the alloy layers 150a and 150b may be omitted.

Then, a lot of nanowires formed in this manner are dispersed in an ethanol solution, for example, and then this solution is applied onto the surface of the device substrate. On the surface of the device substrate for use in this preferred embodiment, provided in advance are gate lines and a gate insulating film that covers the gate lines. When applied onto the surface of the device substrate, the solution may be made to flow in a particular direction on the device substrate. Then, those nanowires that have been dispersed in the solution can be aligned with the flowing direction. By aligning the nanowires by utilizing the solution flow in this manner, a structure on which a lot of nanowires are aligned in a predetermined direction can be formed on the device substrate. For further details of this method, see Non-Patent Document No. 1, for example.

Such a nanowire arrangement includes a great number of nanowires that are distributed on the device substrate at an average gap of about 500 nm to about 1,000 nm, for example. The average gap between the nanowires on the device substrate is controllable by adjusting the density of the nanowires in the solution. That is to say, if the density of the nanowires in the solution is decreased, the nanowires will be present on the device substrate more sparsely. Conversely, if the density of the nanowires in the solution is increased, then the average gap between the nanowires on the device substrate will be narrower. And if necessary, the nanowires may be arranged so densely that adjacent ones of the nanowires contact with each other.

According to such a method, the positions of the respective nanowires on the device substrate cannot be controlled accurately but a great number of nanowires can be aligned in substantially the same direction and arranged at substantially a uniform density.

Thereafter, the process step of forming source and drain electrodes is performed on the device substrate on which a great number of nanowires have been arranged by the method described above. These electrodes may be formed by a known process that is adopted for the purpose of fabricating semiconductor integrated circuits.

Figure 6:
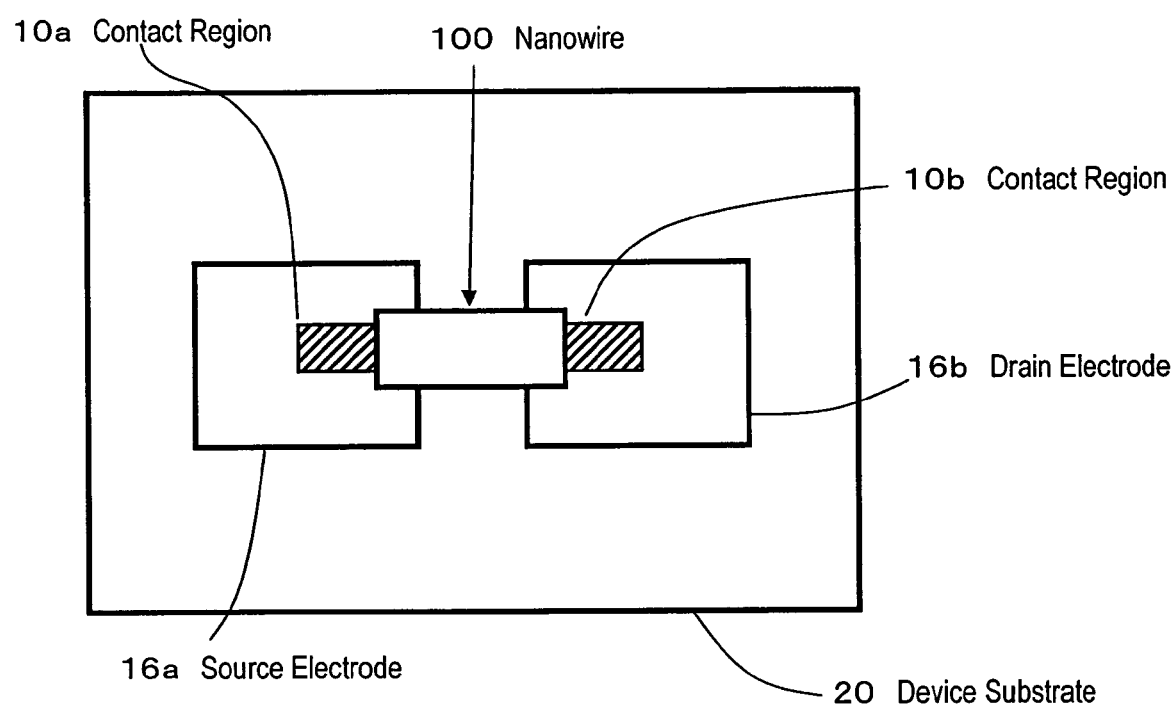
FIG. 6 is a plan view illustrating an exemplary field effect transistor according to the first preferred embodiment.
Figure 7:
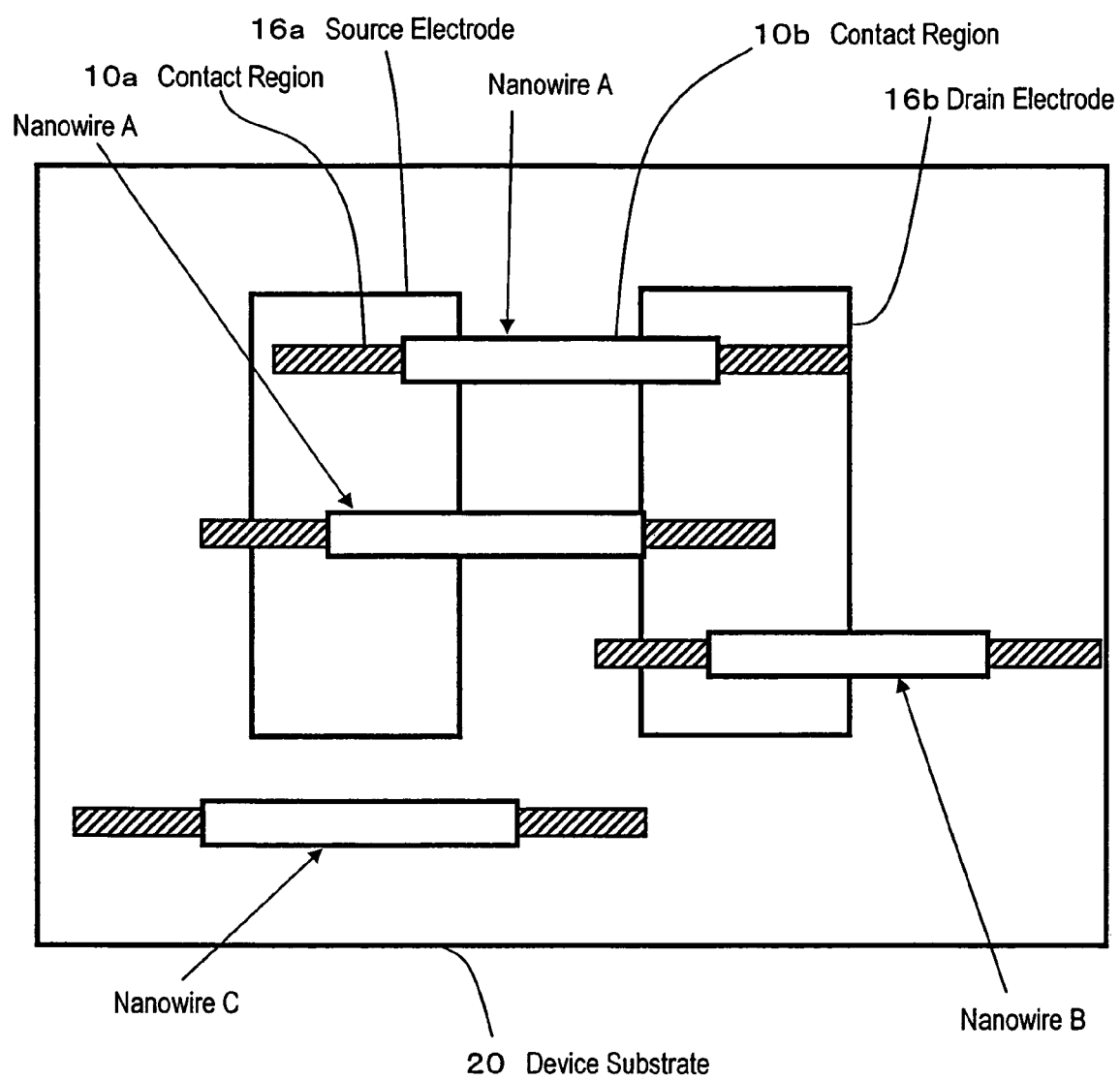
FIG. 7 is a plan view illustrating another exemplary field effect transistor according to the first preferred embodiment.

By performing these process steps, the transistor element shown in FIG. 6 is completed. In the example illustrated in FIG. 6, only one nanowire 100 is arranged between the source electrode 16a and the drain electrode 16b on the device substrate 20. Alternatively, as shown in FIG. 7, a plurality of nanowires may be arranged between the source electrode 16a and the drain electrode 16b. In the example shown in FIG. 7, illustrated are not only those two nanowires A that are electrically connected to both of the source and the drain electrodes 16a and 16b but also a nanowire B that is connected to only one of the two electrodes 16a and 16b and a nanowire C that is connected to neither of the two electrodes 16a and 16b. Among these nanowires A, B and C, only the nanowires A can operate as a channel for the transistor.

Figure 8:
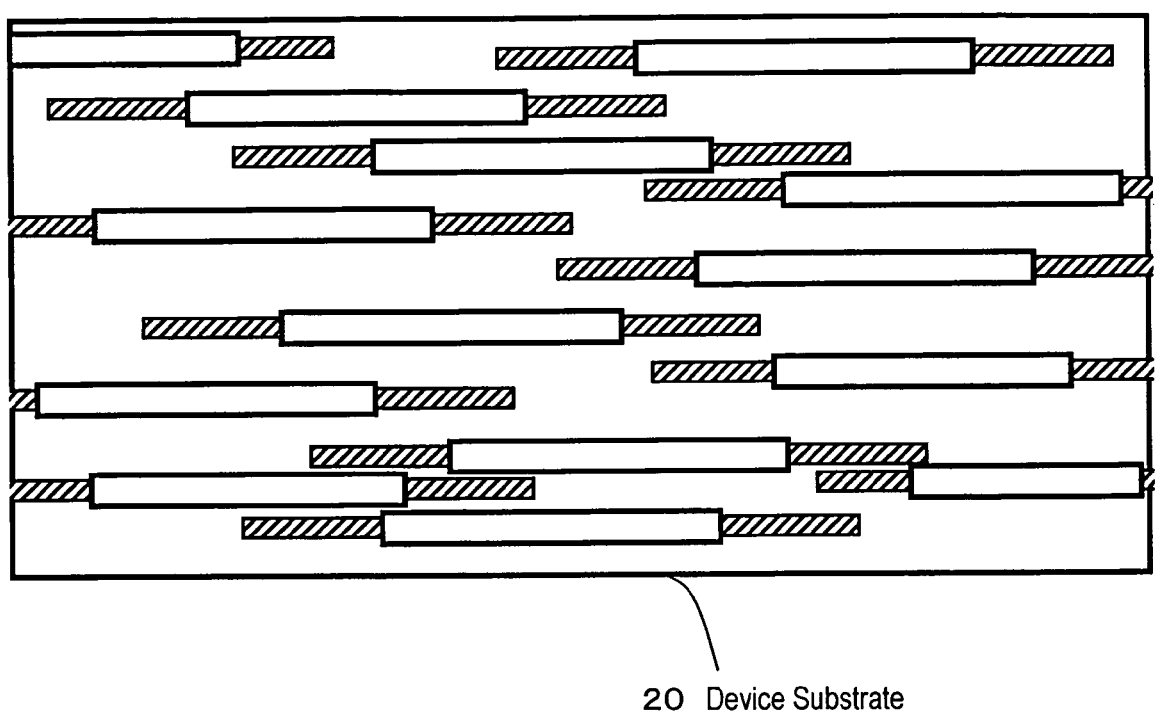
FIG. 8 is a plan view illustrating an alternative device substrate for use in the first preferred embodiment.

As described above, a great number of nanowires are arranged in substantially the same direction on the device substrate 20. When the source electrode 16a and the drain electrode 16b are formed on the device substrate 20 with such a surface state, a conductive film deposition process step, a photolithographic process step and an etching process step are carried out in this order on the device substrate. By appropriately setting the sizes of, and the gap between, the source electrode 16a and the drain electrode 16b, at least one nanowire can be arranged so as to be connected to the source electrode 16a and the drain electrode 16b securely. FIG. 8 shows the surface of a device substrate on which nanowires are arranged at a higher density than in FIG. 7. By further increasing the density of the nanowires, even a film consisting of nanowires can be formed. Such a film will have a semiconductor property that exhibits anisotropic conductivity in the direction in which the nanowires are arranged.

The number of nanowires functioning as a channel region for a single transistor changes with the number and the density of the nanowires that are arranged on the surface of the device substrate. As the number and the density of the nanowires are increased, the number of nanowires that are present between each pair of source/drain electrodes 16a and 16b increases and the variation in the number of nanowires tends to decrease among the respective transistors. Such a dense arrangement of nanowires may function as a sort of a semiconductor film with anisotropy. It is preferable to etch away excessive nanowires from the device substrate after the source and drain electrodes have been formed.

In the preferred embodiment described above, the surface of the contact regions 10a and 10b of each nanowire is alloyed to realize a low contact resistance, but this alloying process step may be omitted. In that case, the surface of the contact regions 10a and 10b of the nanowire will be in the state shown in FIG. 5(f), in which the Ge portion that has been heavily doped with a p- or n-type dopant is exposed. Even when such a nanowire is used, an ohmic contact can also be made with the source and drain electrodes 16a and 16b because the contact regions 10a and 10b can have as high conductivity as that of a metal.

Also, in the preferred embodiment described above, the channel region is defined by the Si portion of the nanowire and the contact regions by the Ge portions thereof. However, the present invention is in no way limited to such a specific preferred embodiment. Alternatively, the channel region may be made of a non-Si semiconductor such as Ge and the contact regions may be made of Si. In that case, the surface of the contact regions reacts with the metal layer to become a silicide. Examples of metals that can be used effectively for this silicidation purpose include Ti, Co and Ni.

To form the insulating layer that selectively covers the channel region, the channel region and the contact regions are preferably made of two different materials to form thermal oxide films with mutually different etch properties as is done in the preferred embodiment described above. However, the combination of semiconductor materials to be used for this purpose is not limited to Si and Ge. For example, even if the channel region is made of $Si_xGe_{1-x}$ (where $0<x<1$) and the contact regions are made of $Si_yGe_{1-y}$ (where $0<y<1$ and $x\neq y$), the resultant thermal oxide films could still have mutually different etch properties due to the difference in the mole fraction (x, y). If this statement is modified so as to include the situation where the channel region is made of Si and the contact regions are made of Ge, the channel region (of a first semiconductor material) is preferably made of $Si_xGe_{1-x}$ (where $0<x\leq 1$) and the contact regions (of a second semiconductor material) are preferably made of $Si_yGe_{1-y}$ (where $0\leq y<1$ and $x\neq y$).

The channel region and the contact regions may be made of a semiconductor material having the same composition. By setting the dopant concentration higher in the contact regions than in the channel region, the thermal oxide films on the surface of the nanowire could have mutually different etch properties. If the thermal oxide film on the surface of the contact regions can be etched selectively, only the contact regions can have their surface exposed without being subjected to any photolithographic process.

As described above, in this preferred embodiment, the surface of the contact regions can be exposed by a sort of self-aligning technique by setting the etch rate of the portions of the thermal oxide film that cover the surface of the contact regions on the nanowire higher than that of the other portion of the thermal oxide film that covers the surface of the channel region. Alternatively, instead of adopting such a self-aligning technique, an insulating film that covers only the channel region may be formed by performing additional photolithographic and etching processes. However, it is difficult to define a resist mask, which covers only the channel regions of the respective nanowires on the substrate, by a photolithographic process. That is why the contact regions and the channel region of each nanowire are preferably made of mutually different semiconductor materials as is done in this preferred embodiment.

If the contact regions and the channel region of each nanowire are made of different materials, a metal layer may be selectively grown on only the surface of the contact regions to form conductive portions there, and then the surface of the channel region may be treated to have an insulating property.

EMBODIMENT 2

Hereinafter, a second preferred embodiment of the present invention will be described with reference to FIGS. 9(a) and 9(b).

Figure 9:
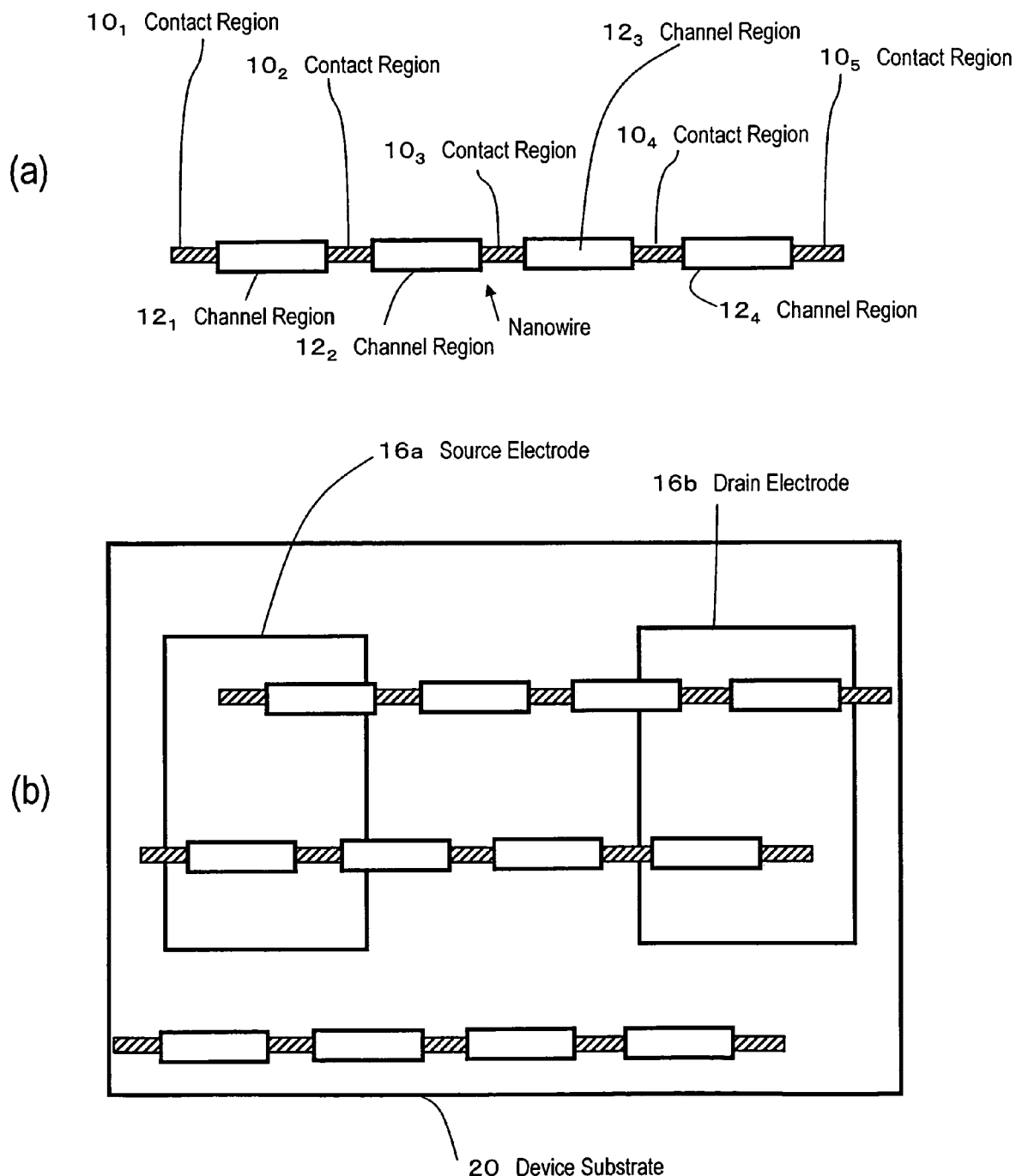
FIG. 9(a) illustrates a nanowire according to a second preferred embodiment of the present invention and FIG. 9(b) is a plan view illustrating a field effect transistor according to the second preferred embodiment.

FIG. 9(a) shows a nanowire according to this preferred embodiment, and FIG. 9(b) is a plan view illustrating a field effect transistor that has been formed using such nanowires.

This preferred embodiment is characterized in that a single nanowire includes three or more contact regions $10_1$ through $10_N$ (where N is an integer equal to or greater than three) and two or more channel regions $12_1$ through $12_M$ (where M is an integer equal to or greater than two) as shown in FIG. 9(a).

Such a nanowire can be made by repeatedly performing the crystal-growing process that has already been described with reference to FIGS. 5(a) through 5(d) so as to alternately grow the Ge and Si portions, for example. As in the first preferred embodiment described above, only the Si portion is covered with an insulating film and the surface of the Ge portion is selectively alloyed.

As can be seen from FIG. 9(b), the "channel length" of each nanowire connected to the source and drain electrodes 16a and 16b is proportional to the number (P) of channel regions interposed between the contact region in contact with the source electrode 16a and the contact region in contact with the drain electrode 16b. That is to say, the channel length=the length of a single channel region×P. A dimension corresponding to the channel width is proportional to the number of nanowires that connect the source and drain electrodes 16a and 16b together.

Figure 10:
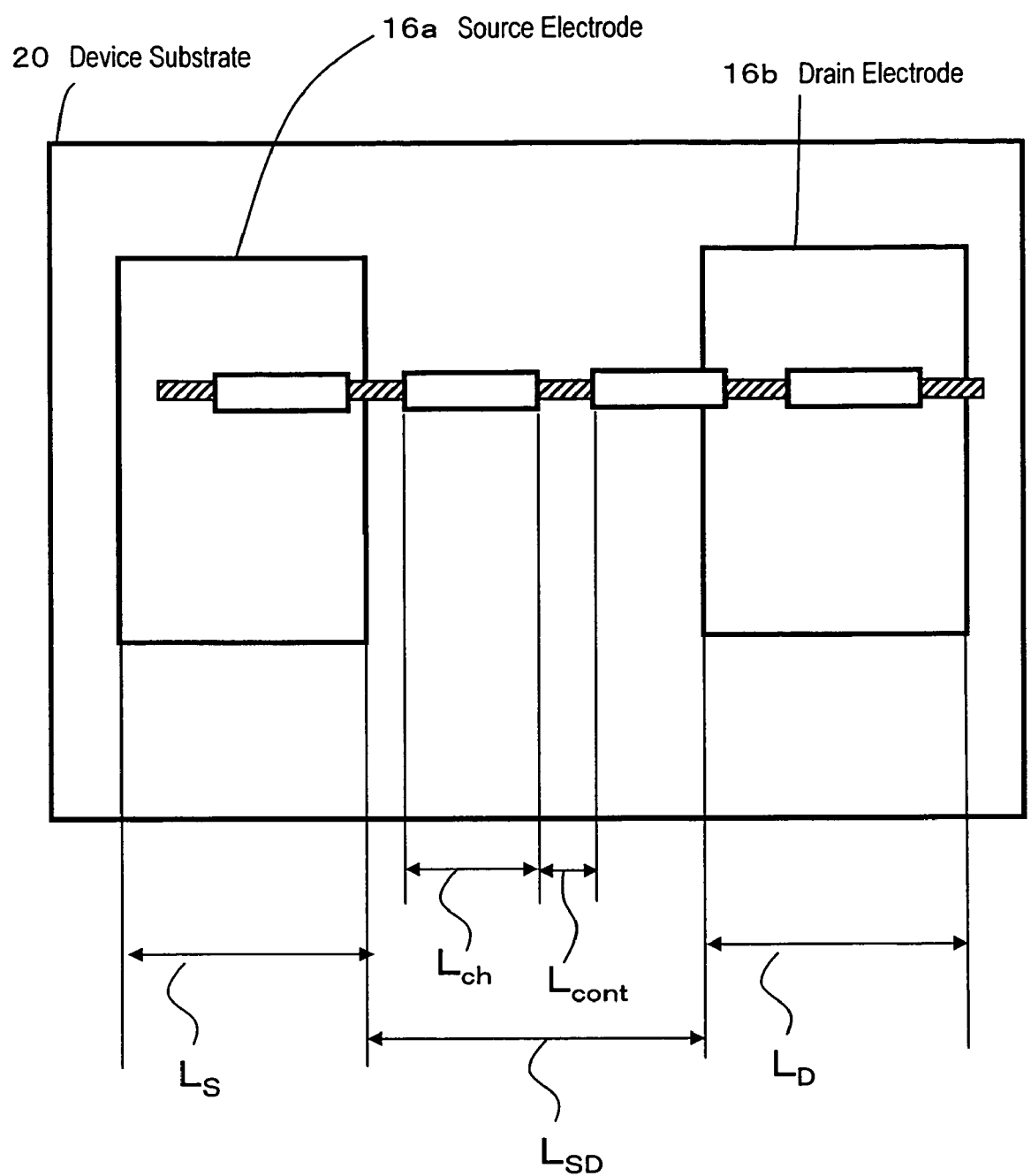
FIG. 10 is a plan view illustrating a layout for the field effect transistor of the second preferred embodiment along with the sizes of the respective elements thereof.

Next, a situation where the source/drain electrodes 16a and 16b have shifted along the axis of nanowire will be discussed with reference to FIG. 10. In this example, suppose the length of each channel region is identified by $L_{ch}$, the distance between the source and drain electrodes by $L_{SD}$, the length of each contact region by $L_{cont}$, the length of the source electrode 16a in the channel length direction by $L_S$, and the length of the drain electrode 16a in the channel length direction by $L_D$.

Even if the source and drain electrodes 16a and 16b have shifted significantly along the axis of the nanowire, field effect transistors can also be fabricated with a good yield without performing any special alignment process as long as appropriate contact can always be maintained.

To realize such an "alignment-free" manufacturing process, the following requirements should be considered.

First of all, the source electrode 16a and the drain electrode 16b need to always keep contact with respectively different contact regions. For that purpose, the following inequalities need to be satisfied:

$$L_S > L_{ch} \quad (1)$$

$$L_D > L_{ch} \quad (2)$$

$$L_{SD} > L_{CONT} \quad (3)$$

As long as Inequality (1) is satisfied, even if the source electrode 16a has shifted laterally, at least a portion of the contact regions can always keep contact with the source electrode 16a. Likewise, as long as Inequality (2) is satisfied, even if the drain electrode 16b has shifted laterally, at least a portion of the contact regions can always keep contact with the drain electrode 16b. To reduce the contact resistance, these areas of contact are preferably expanded. To do so, $L_S$ and $L_D$ may have sufficiently increased values (e.g., values exceeding $L_{ch}+L_{CONT}$).

If Inequality (3) is satisfied, it is possible to prevent the source and drain electrodes 16a and 16b from contacting and being short-circuited with the same contact region. $L_{SD}$ should be shorter than the overall length of the nanowire.

As can be seen from the foregoing description, if $L_{ch}$ and $L_{CONT}$ are sufficiently shorter than the sizes of, and the distance between, the source and drain electrodes 16a and 16b on the device substrate and if the nanowire is sufficiently long, then there is no need to perform any alignment processes along the axis of the nanowire.

In order to apply the "alignment-free" technique when the nanowires are aligned with each other perpendicularly to the channel length direction, the number and density of the nanowires on the device substrate are preferably increased to the point that the source and drain electrodes 16a and 16b cross a lot of (e.g., 50 or more) nanowires.

In the nanowire of this preferred embodiment, the contact regions and the channel regions are preferably arranged alternately at a predetermined pitch along the axis of the nanowire. The pitch ($L_{ch}+L_{CONT}$) may be set within the range of 300 nm to 3,000 nm, for example. Also, the length of each channel region along the nanowire axis may be in the range of 100 nm to 1,000 nm, for example.

EMBODIMENT 3

Hereinafter, a third preferred embodiment of the present invention will be described with reference to FIG. 11.

Figure 11:
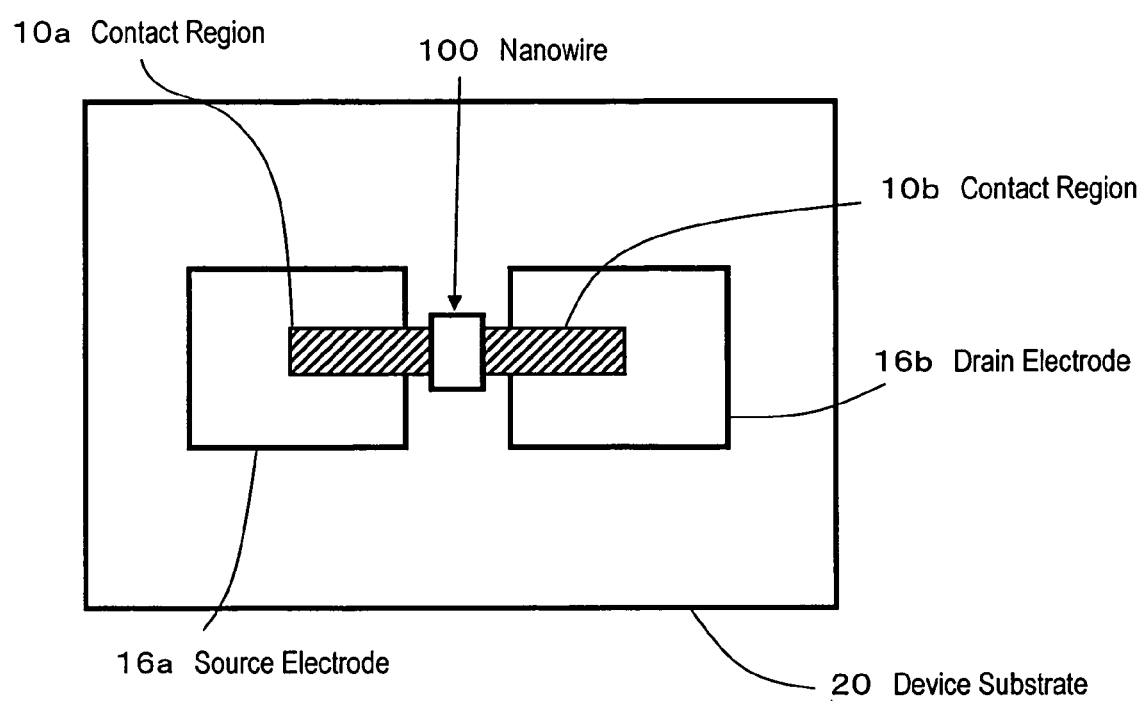
FIG. 11 is a plan view illustrating a field effect transistor according to a third preferred embodiment of the present invention.

FIG. 11 is a plan view illustrating a field effect transistor that has been formed using a nanowire 200 according to this preferred embodiment. The field effect transistor shown in FIG. 11 is different from the counterpart shown in FIG. 6 in that the length of the channel region of the nanowire 200 is shorter than the distance between the source and drain electrodes 16a and 16b.

In this preferred embodiment, the channel length is shortened to less than the resolution limit of the photolithography technology. As described above, the channel length of the transistor is defined by the length of the channel region of the nanowire, and the latter length is arbitrarily controllable by the nanowire growth process. Consequently, the length of the channel region can be reduced to a very small value (e.g., in the range of 50 nm to 1,000 nm and preferably 500 nm or less) irrespective of the resolution limit of the photolithography technology.

EMBODIMENT 4

Hereinafter, a fourth preferred embodiment of the present invention will be described with reference to FIGS. 12(a) through 12(c).

Figure 12:
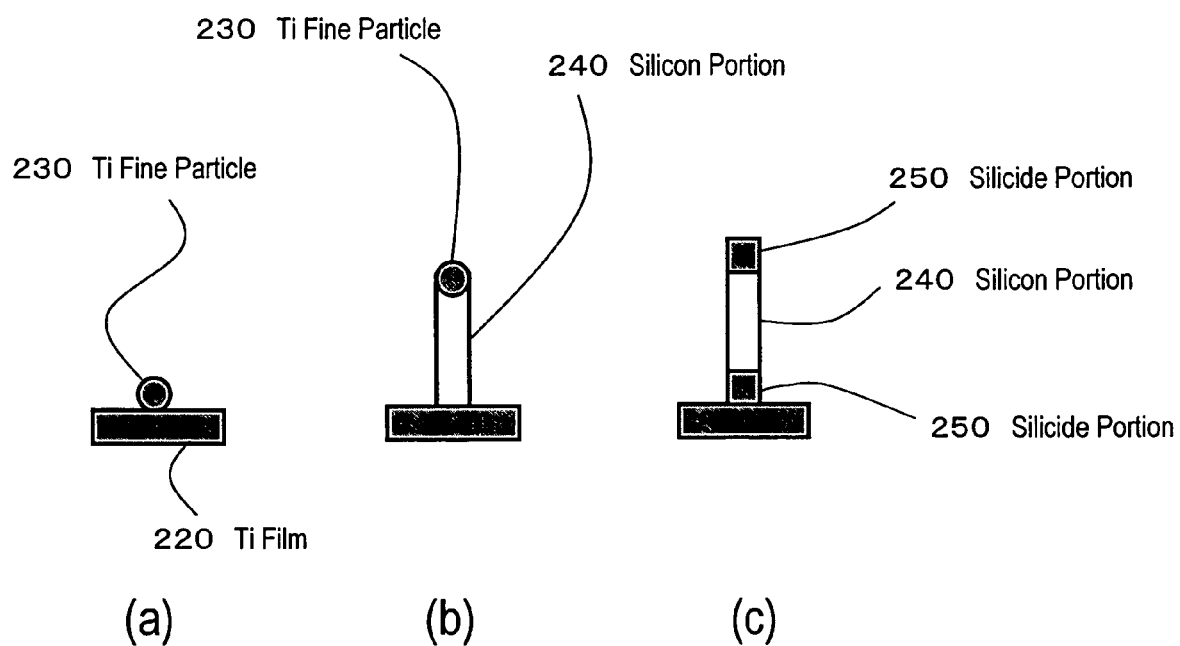
FIGS. 12(a) through 12(c) are cross-sectional views illustrating respective process steps for making a nanowire according to a fourth preferred embodiment of the present invention.

In this preferred embodiment, a growth substrate, including a Ti film 220 thereon, is provided as shown in FIG. 12(a). Next, a Ti fine particle 230 is formed on the Ti film 220 on the growth substrate.

Subsequently, a silicon portion 240 to form the nanowire is grown by substantially the same method as that described above, thereby obtaining the structure shown in FIG. 12(b).

Thereafter, a heat treatment process is conducted at a temperature of 600° C. to 800° C., for example, thereby siliciding portions in which Ti contacts with the silicon portion 240. In this manner, silicide portions 250 are formed as shown in FIG. 12(c).

According to the method of this preferred embodiment, there is no need to separately deposit a metal film on the surface of the nanowire for the purpose of silicidation.

Figure 13:
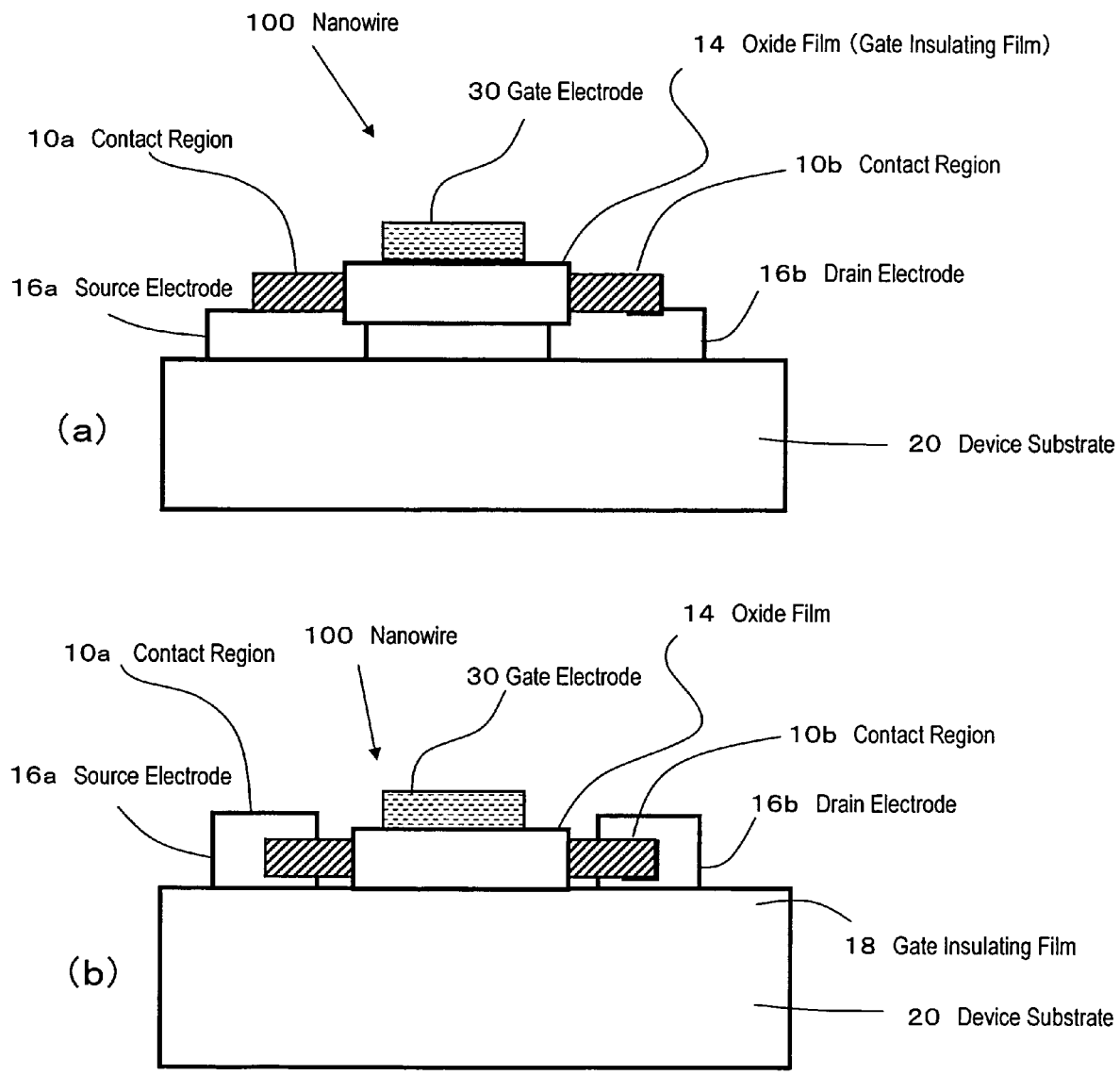
FIGS. 13(a) and 13(b) are cross-sectional views illustrating another configuration for an electronic device according to the present invention.

It should be noted that electronic elements that can be fabricated using the nanowires of the present invention are not limited to transistors having the configuration shown in FIG. 1(b). FIGS. 13(a) and 13(b) illustrate a configuration for another electronic element according to the present invention. In the example illustrated in FIGS. 13(a) and 13(b), the oxide film 14 that has been formed on the channel region of the nanowire is used as a gate insulating film and a gate electrode 300 is formed so as to extend over the nanowire 100. That is to say, this is a so-called "top-gate transistor". In this example, after the gate electrode 30 has been formed, dopant ions are implanted into the nanowire 100, thereby defining source/drain regions.

In FIGS. 6, 11 and so on, the source/drain electrodes 16a and 16b are illustrated as being arranged closer to the device substrate 20 than to the nanowire 100. Actually, however, the nanowire 100 may be arranged between the source/drain electrodes 16a, 16b and the device substrate 20. To realize low contact resistance, the arrangement is preferably determined so as to increase the areas of contact between the source/drain electrodes 16a, 16b and the contact regions 10a, 10b of the nanowire 100.

INDUSTRIAL APPLICABILITY

A nanowire according to the present invention makes it possible to form a field effect transistor on a substrate, which is made of a plastic or any other material that cannot resist a high-temperature process, and contributes to realizing low-resistance contact between the source/drain electrodes and the nanowire itself. Such a field effect transistor can be used particularly effectively as a switching element or a driver for a thin flat panel display.

In addition, a nanowire according to the present invention can also be used effectively to make a very small short-channel transistor, which would be hard to form by the conventional photolithographic process.

What is claimed is:

1. A nanowire comprising;
a plurality of contact regions; and
at least one channel region, which is connected to the contact regions,
wherein the channel region is made of a first semiconductor material and the surface of the channel region is covered with an insulating layer that has been formed on the channel region,
wherein the contact regions are made of a second semiconductor material, which is different from the first semiconductor material for the channel region, and at least the surface of the contact regions includes a conductive portion,
wherein the insulating layer covers the surface of the channel region but does not cover the surface of the contact regions, and
wherein the channel region and the contact regions are adjoined along an axis direction of the nanowire.

2. The nanowire of claim 1, wherein the first semiconductor material is $Si_xGe_{1-x}$ (where $0<x\leq1$) and the second semiconductor material is $Si_yGe_{1-y}$ (where $0\leq y<1$ and $x\neq y$).

3. The nanowire of claim 1, wherein the insulating layer is formed by thermally oxidizing the surface of the channel region.

4. The nanowire of claim 1, wherein the channel region has a length of 1,000 nm or less as measured along the axis of the nanowire.

5. The nanowire of claim 1, wherein the conductive portion of the contact regions is made of the second semiconductor material that has been doped with a dopant and that has a higher conductivity than the channel region.

6. The nanowire of claim 1, wherein the conductive portion of the contact regions is made of an alloy in which a constituent element of the second semiconductor material and a metal element are bonded together.

7. The nanowire of claim 6, wherein the contact regions include a core portion, which is made of a semiconductor material including an element that is bonded to the metal element in the conductive portion.

8. The nanowire of claim 7, wherein the alloy is either a metal compound of silicon or a metal compound of germanium.

9. The nanowire of claim 1, wherein the number of the contact regions is N, which is an integer equal to or greater than three, and the number of the channel region is M, which is N−1.

10. The nanowire of claim 9, wherein the contact regions and the channel regions are alternately arranged at a predetermined pitch along the axis of the nanowire.

11. The nanowire of claim 9, wherein the nanowire is arranged between two electrodes, each of which is electrically in contact with at least a portion of the contact regions of the nanowire, and
wherein if the length of each said channel region is Lch, the distance between the two electrodes is LSD, the length of the contact regions is Lcont, the length of one of the two electrodes in a channel length direction is LS, and the length of the other electrode in the channel length direction is LD, the following inequalities:

$$LS>Lch \quad (1)$$

$$LD>Lch \quad (2)$$

$$LSD>Lcont \quad (3)$$

are satisfied.

12. The nanowire of claim 1, wherein the channel region does not contain the second semiconductor material, and the contact regions do not contain the first semiconductor material.

13. An electronic element comprising:
at least one nanowire; and
a plurality of electrodes, which are electrically connected to the nanowire,
wherein each said nanowire includes: a plurality of contact regions, including two contact regions that contact with associated ones of the electrodes, and at least one channel region, which is connected to the contact regions,
wherein the channel region is made of a first semiconductor material and is covered with an insulating layer that has been formed on the channel region,
wherein the contact regions are made of a second semiconductor material, which is different from the first semiconductor material, and at least the surface of the contact regions includes a conductive portion,
wherein the insulating layer covers the surface of the channel region but does not cover the surface of the contact regions, and
wherein the channel region and the contact regions are adjoined along an axis direction of the nanowire.

14. The electronic element of claim 13, further comprising a gate electrode, which is insulated from the channel region and which applies an electric field to the channel region.

15. An electronic device comprising:
a plurality of electronic elements of claim 14;
a line for connecting the electrodes together; and
a substrate for supporting the electronic elements and the line thereon.

16. The electronic device of claim 15, wherein the nanowires included in the electronic elements are aligned in a particular direction on the substrate.

17. The electronic element of claim 13, wherein the channel region has a length of 1,000 nm or less as measured along the axis of the nanowire.

18. The electronic element of claim 13, wherein the channel region does not contain the second semiconductor material, and the contact regions do not contain the first semiconductor material.

19. A nanowire comprising:
a plurality of contact regions; and
at least one channel region, which is connected to the contact regions, wherein the channel region is made of a first semiconductor material and the surface of the channel region is covered with an insulating layer that has been formed on the channel region, wherein the contact regions are made of a second semiconductor material, which is different from the first semiconductor material for the channel region, and at least the surface of the contact regions includes a conductive portion, wherein the insulating layer covers the surface of the channel region but does not cover the surface of the contact regions, and wherein the first semiconductor material and the second semiconductor material are capable of forming thermal oxide films with mutually different etch properties.

20. The nanowire of claim 19, wherein the first semiconductor material is $Si_xGe_{1-x}$ (where $0<x\leqq1$) and the second semiconductor material is $Si_yGe_{1-y}$ (where $0\leqq y <1$ and $X \neq y$).

21. The nanowire of claim 19, wherein the insulating layer is formed by thermally oxidizing the surface of the channel region.

22. The nanowire of claim 19, wherein the channel region has a length of 1,000 nm or less as measured along the axis of the nanowire.

23. The nanowire of claim 19, wherein the conductive portion of the contact regions is made of the second semiconductor material that has been doped with a dopant and has a higher conductivity than the channel region.

24. The nanowire of claim 19, wherein the conductive portion of the contact regions is made of an alloy in which a constituent element of the second semiconductor material and a metal element are bonded together.

25. The nanowire of claim 24, wherein the contact regions include a core portion, which is made of a semiconductor material including an element that is bonded to the metal element in the conductive portion.

26. The nanowire of claim 25, wherein the alloy is either a metal compound of silicon or a metal compound of germanium.

27. The nanowire of claim 19, wherein an etch rate of the second semiconductor material is set higher than that of the first semiconductor material.

28. An electronic element comprising:
at least one nanowire; and
a plurality of electrodes, which are electrically connected to the nanowire,
wherein each said nanowire includes a plurality of contact regions, including two contact regions that contact with associated ones of the electrodes, and at least one channel region, which is connected to the contact regions,
wherein the channel region is made of a first semiconductor material and is covered with an insulating layer that has been formed on the channel region,
wherein the contact regions are made of a second semiconductor material, which is different from the first semiconductor material, and at least the surface of the contact regions includes a conductive portion,
wherein the insulating layer covers the surface of the channel region but does not cover the surface of the contact regions, and
wherein the first semiconductor material and the second semiconductor material are capable of forming thermal oxide films with mutually different etch properties.

29. The electronic element of claim 28, further comprising a gate electrode, which is insulated from the channel region and which applies an electric field to the channel region.

30. An electronic device comprising:
a plurality of electronic elements of claim 29;
a line for connecting the electrodes together; and
a substrate for supporting the electronic elements and the line thereon.

31. The electronic device of claim 30, wherein the nanowires included in the electronic elements are aligned in a particular direction on the substrate.

32. The electronic element of claim 28, wherein the channel region has a length of 1,000 nm or less as measured along the axis of the nanowire.

33. The nanowire of claim 28, wherein an etch rate of the second semiconductor material is set higher than that of the first semiconductor material.

34. A nanowire comprising:
a plurality of contact regions; and
at least one channel region, which is connected to the contact regions,
wherein the channel region is made of a first semiconductor material and the surface of the channel region is covered with an insulating layer that has been formed on the channel region,
wherein the contact regions are made of a second semiconductor material, which is different from the first semiconductor material for the channel region, and at least the surface of the contact regions includes a conductive portion,
wherein the insulating layer covers the surface of the channel region but does not cover the surface of the contact regions, and
wherein the conductive portion of the contact regions is made of an alloy in which a constituent element of the second semiconductor material and a metal element are bonded together.

35. The nanowire of claim 34, wherein the contact regions include a core portion, which is made of a semiconductor material including an element that is bonded to the metal element in the conductive portion.

36. The nanowire of claim 35, wherein the alloy is either a metal compound of silicon or a metal compound of germanium:

37. An electronic element comprising:
at least one nanowire; and
a plurality of electrodes, which are electrically connected to the nanowire,
wherein each said nanowire includes: a plurality of contact regions, including two contact regions that contact with associated ones of the electrodes, and at least one channel region, which is connected to the contact regions,
wherein the channel region is made of a first semiconductor material and is covered with an insulating layer that has been formed on the channel region,
wherein the contact regions are made of a second semiconductor material, which is different from the first semiconductor material, and at least the surface of the contact regions includes a conductive portion,
wherein the insulating layer covers the surface of the channel region but does not cover the surface of the contact regions, and
wherein the conductive portion of the contact regions is made of an alloy in which a constituent element of the second semiconductor material and a metal element are bonded together.

38. A nanowire comprising:
a plurality of contact regions; and
at least one channel region, which is connected to the contact regions, wherein the channel region is made of a first semiconductor material and the surface of the channel region is covered with an insulating layer that has been formed on the channel region, wherein the contact regions are made of a second semiconductor material, which is different from the first semiconductor material for the channel region, and at least the surface of the contact regions includes a conductive portion, wherein the insulating layer covers the surface of the channel region but does not cover the surface of the contact regions, and wherein the insulating layer is formed by thermally oxidizing the surface of the channel region.

39. An electronic element comprising:

at least one nanowire; and a plurality of electrodes, which are electrically connected to the nanowire, wherein each said nanowire includes a plurality of contact regions, including two contact regions that contact with associated ones of the electrodes, and at least one channel region, which is connected to the contact regions, wherein the channel region is made of a first semiconductor material and is covered with an insulating layer that has been formed on the channel region, wherein the contact regions are made of a second semiconductor material, which is different from the first semiconductor material, and at least the surface of the contact regions includes a conductive portion, wherein the insulating layer covers the surface of the channel region but does not cover the surface of the contact regions, and wherein the insulating layer is formed by thermally oxidizing the surface of the channel region.

* * * * *

UNITED STATES PATENT AND TRADEMARK OFFICE
CERTIFICATE OF CORRECTION

| | | |
|---|---|---|
| PATENT NO. | : 7,629,629 B2 | Page 1 of 1 |
| APPLICATION NO. | : 10/588605 | |
| DATED | : December 8, 2009 | |
| INVENTOR(S) | : Tohru Saitoh et al. | |

It is certified that error appears in the above-identified patent and that said Letters Patent is hereby corrected as shown below:

Title page, Item "(56) References Cited", page 2 under "FOREIGN PATENT DOCUMENTS",
the reference "WO WO 02/080280 A1   10/2002" should be listed as --WO  02/080280 A1  10/2002--;
the reference "WO WO 03/046536 A1    6/2003" should be listed as --WO  03/046536 A1   6/2003--;
the reference "WO WO 2004/032191 A2 4/2004" should be listed as --WO 2004/032191 A2 4/2004--; and
the reference "WO WO 2004/032193 A2 4/2004" should be listed as --WO 2004/032193 A2 4/2004--.

Signed and Sealed this

Seventeenth Day of August, 2010

David J. Kappos
*Director of the United States Patent and Trademark Office*